(12) United States Patent
Andrews et al.

(10) Patent No.: US 7,215,149 B1
(45) Date of Patent: May 8, 2007

(54) INTERFACE CIRCUITRY FOR ELECTRICAL SYSTEMS

(75) Inventors: William B. Andrews, Emmaus, PA (US); Larry R. Fenstermaker, Nazareth, PA (US); John Schadt, Bethlehem, PA (US); Mou C. Lin, High Bridge, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 187 days.

(21) Appl. No.: 11/012,550

(22) Filed: Dec. 15, 2004

(51) Int. Cl.
*H03K 19/0175* (2006.01)
(52) U.S. Cl. .......................... 326/83; 326/81
(58) Field of Classification Search ............ 326/80–87, 326/63, 68, 119, 121
See application file for complete search history.

(56) References Cited

U.S. PATENT DOCUMENTS

| | | | |
|---|---|---|---|
| 6,262,599 B1 * | 7/2001 | Coughlin et al. | 326/81 |
| 6,281,706 B1 * | 8/2001 | Wert et al. | 326/83 |
| 6,335,637 B1 * | 1/2002 | Correale et al. | 326/80 |
| 6,529,045 B2 * | 3/2003 | Ye et al. | 326/95 |
| 6,731,134 B1 * | 5/2004 | Bucossi et al. | 326/56 |
| 6,867,615 B1 * | 3/2005 | Plants et al. | 326/40 |
| 6,952,118 B2 * | 10/2005 | Jamshidi et al. | 326/98 |

* cited by examiner

*Primary Examiner*—Don Le
(74) *Attorney, Agent, or Firm*—Steve Mendelsohn

(57) ABSTRACT

An electrical system has a master circuit and an interface (I/F) circuit. The master circuit generates a master output signal. The I/F circuit receives an I/F input signal and a flag signal and generates an I/F output signal for application to a slave circuit, wherein the I/F input signal is based on the master output signal, and the interface circuit generates the L/F output signal either dependent on or independent of the I/F input signal as indicated by the flag signal.

30 Claims, 8 Drawing Sheets

NOR Control:

NAND Control:

INTERFACE CIRCUITRY FOR ELECTRICAL SYSTEMS

TECHNICAL FIELD

The present invention relates to electronics, such as field-programmable gate arrays (FPGAs) and other programmable devices, and, in particular, to interface circuitry used to buffer signals between different sets of circuitry, such as those operating under different power-supply domains where level-shifting circuitry converts signals between the different power-supply domains.

BACKGROUND

Newer integrated circuit (IC) technologies typically operate at lower power-supply voltage levels. Because different IC technologies support different voltage levels, different I/O signaling standards have been developed for different IC technologies. It is often desirable, however, to provide a programmable device such as an FPGA that can support multiple, different I/O signaling standards in order to be able to configure the programmable device with different external components that conform to the different I/O signaling standards. Such a programmable device is typically implemented with different sets of circuitry operating under different power-supply domains.

For example, in order to communicate with an external component implemented using older IC technology that operates under a higher-voltage power-supply domain, an FPGA may have I/O circuitry implemented using the older IC technology and a programmable logic core implemented using newer IC technology operating under a lower-voltage power-supply domain.

In order for the higher-voltage I/O circuitry to communicate with the lower-voltage logic core, such an FPGA is typically implemented with level-shifting circuitry that converts signals generated under one power-supply domain into corresponding signals conforming to a different power-supply domain.

Under normal operating conditions, where both power supplies provide power at their proper full-voltage levels, such level-shifting circuitry operates properly to convert signals between the two power-supply domains. However, under certain conditions, for example, where the voltage generated by one power supply is not at its proper full-voltage level, the level-shifting circuitry may generate indeterminate output signals that can lead to undesirable results in the circuitry that receives those output signals. Depending on the particular situation, the condition may exist for a relatively long period of time (e.g., when a power supply is faulty or even inoperative) or for a relatively short period of time (e.g., during power-on where one power supply reaches its full-voltage level before another or during hot-socket operations where a component is configured into a system that is already powered on, but where the different power-supply voltage levels within the newly added component ramp up at different times and/or at different rates).

SUMMARY

In one embodiment, the present invention is an electrical system comprising a master circuit and an interface (I/F) circuit. The master circuit is adapted to generate a master output signal. The I/F circuit is adapted to receive an I/F input signal and a flag signal and generate an I/F output signal for application to a slave circuit, wherein the I/F input signal is based on the master output signal, and the interface circuit is adapted to generate the I/F output signal either dependent on or independent of the I/F input signal as indicated by the flag signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
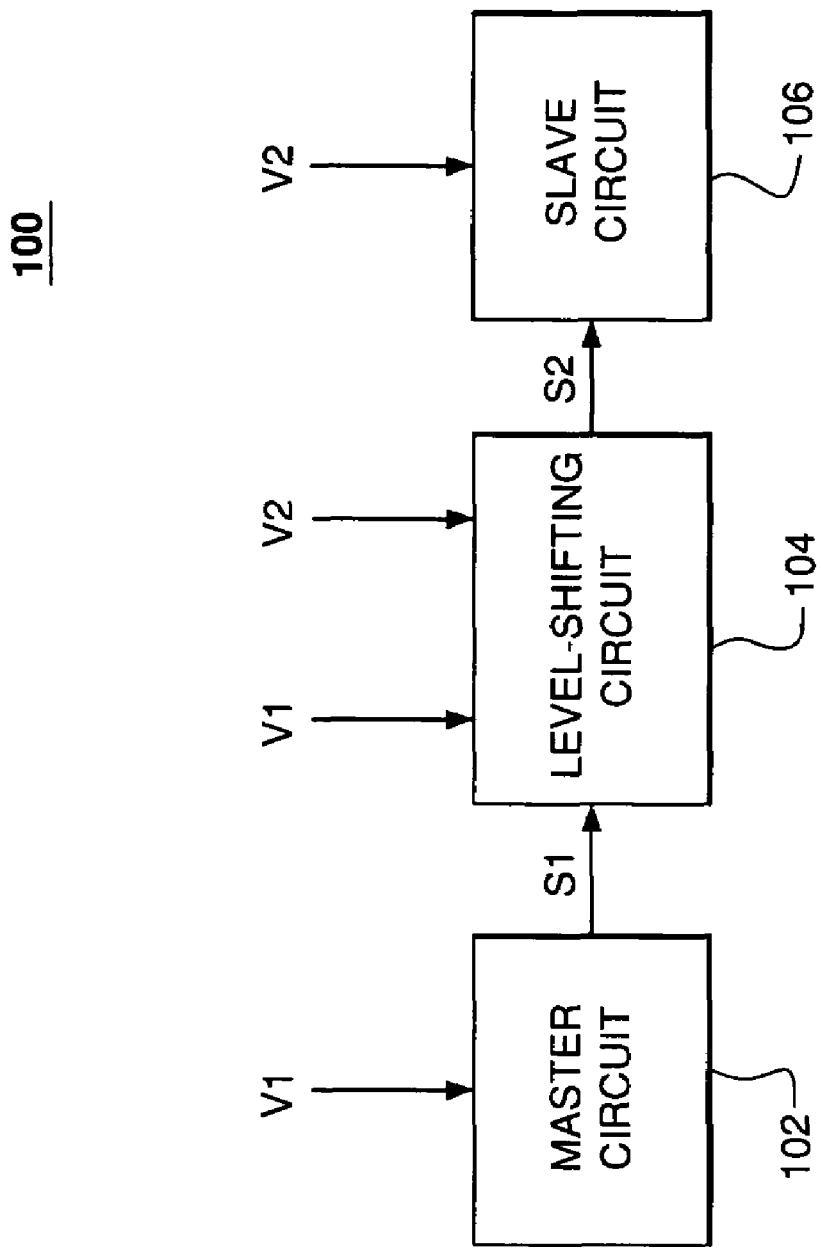
FIG. 1 shows a block diagram of an electrical system having (at least) two power supplies.

FIG. 1 shows a block diagram of an electrical system 100 operating under (at least) two power-supply domains: one based on voltage level V1 and the other based on voltage level V2 different from V1. Electrical system 100 includes master circuit 102, level-shifting circuit 104, and slave circuit 106. The operations of slave circuit 106, which operates under the domain of power supply V2, depend, at least in part, on the results of processing implemented within master circuit 102, which operates under the domain of power supply V1.

In certain implementations, for example, when slave circuit 106 cannot safely and/or accurately operate with input signals generated under the V1 domain, a level-shifting circuit is provided to convert V1-domain signals generated by master circuit 102 into V2-domain signals for input to slave circuit 106. For example, as shown in FIG. 1, level-shifting circuit 104, which receives both power-supply voltages V1 and V2, converts a V1-domain signal S1 generated by master circuit 102 into a V2-domain signal S2 for input to slave circuit 106. Depending on the particular embodiment, V1 may be either greater than or less than V2. In certain other embodiments, the magnitudes of V1 and V2 could be equal, where the different power-supply domains differ in some other way (e.g., tolerance requirements, noise immunity requirements, power-up ramp rates).

Figure 2:
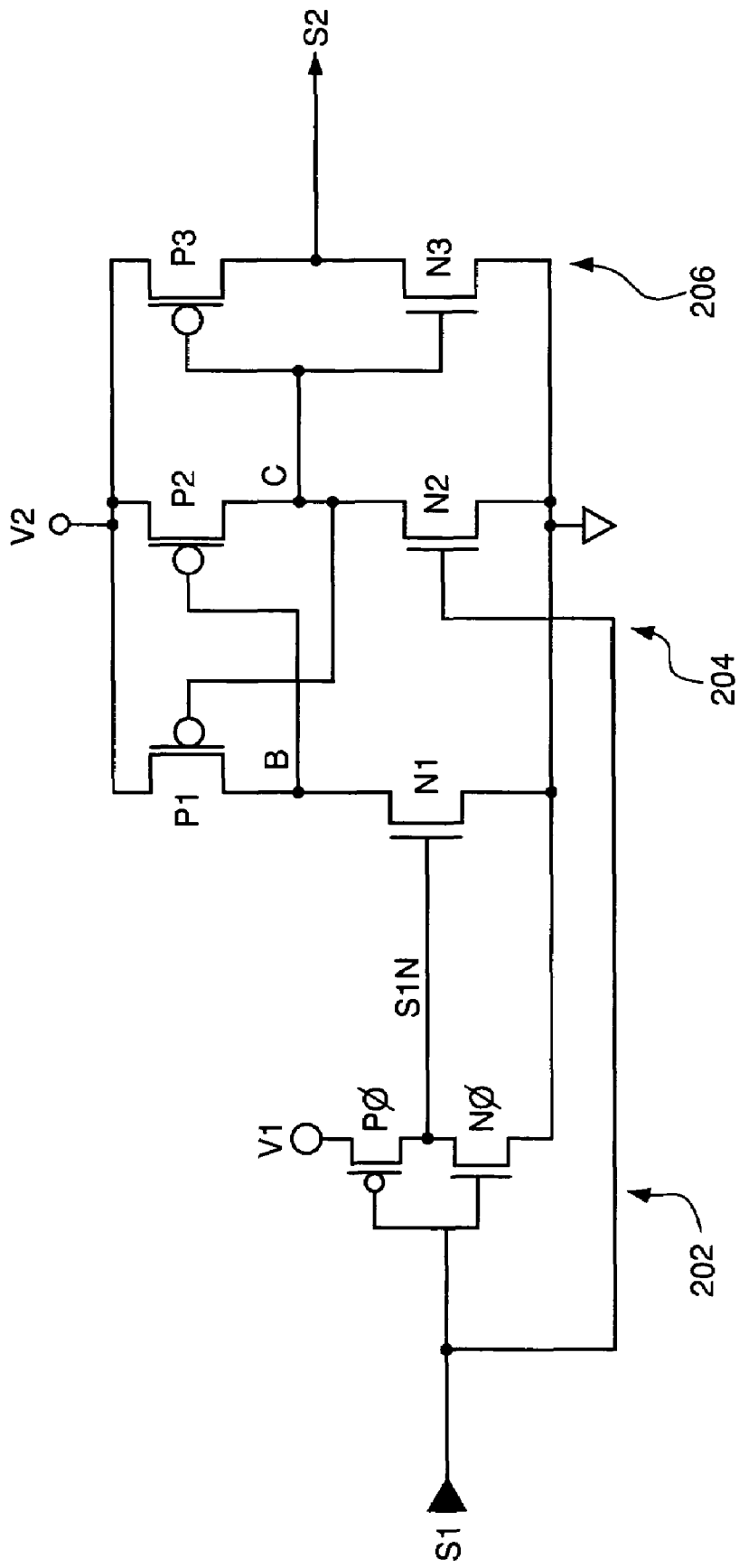
FIG. 2 shows a circuit diagram of a conventional level-shifting circuit that could be used to implement the level-shifting circuit of FIG. 1.

FIG. 2 shows a circuit diagram of a conventional level-shifting circuit 200 that could be used to implement level-shifting circuit 104 of FIG. 1. Level-shifting circuit 200 comprises four P-type and four N-type (e.g., MOSFET) transistors, connected as shown, where transistors P0, N0 are connected to function as an inverter 202, transistors P1, P2, N1, N2 are connected to function as a cascode-type level shifter 204, and transistors P3, N3 are connected to function as an inverting output buffer 206. One purpose of providing output buffer 206 is to enable level-shifting circuit 104 to drive slave circuit 106 of FIG. 1, when circuits 104 and 106 are located relatively far away from each other within electrical system 100. As indicated in FIG. 2, inverter 202 operates under the V1 domain, while level shifter 204 and output buffer 206 operate under the V2 domain.

During normal operations (e.g., when power supplies V1 and V2 generate and apply their proper full-voltage levels), if input signal S1 is low, then P0 is on, N0 and N2 are off, and node S1N is driven to V1 (i.e., high). If S1N is high, then N1 is on and node B is driven low. If node B is low, then P2 is on and node C is driven to V2 (i.e., high). If node C is high, then P1 and P3 are off, N3 is on, and output signal S2 is driven low. Thus, if V1-domain input signal S1 is low, then V2-domain output signal S2 is driven low.

On the other hand, if S1 is high, then P0 is off, N0 and N2 are on, and node S1N is driven low and N1 is off. If N2 is on, then node C is driven low. If node C is low, then P1 and P3 are on and N3 is off. If P1 is on, then node B is driven to V2 (i.e., high) and P2 is off. If P3 is on and N3 is off, then output signal S2 is driven to V2 (i.e., high). Thus, if V1-domain input signal S1 is high, then V2-domain output signal S2 is driven high.

Assume however a condition where V2 is at its proper full-voltage level, but where V1 is not at its proper full-voltage level. Such a condition may exist under a number of different circumstances, some where the condition exists long-term (e.g., where the V1 power supply is faulty or even completely inoperative) and others where the condition exists only short-term (e.g., during power-on or hot-socket operations where the V2 power-supply voltage happens to reach its full-voltage level before the V1 power-supply voltage does).

If the V1 power supply is not generating its proper full-voltage level, then signal S1 generated by master circuit 102 of FIG. 1 may be indeterminate, that is, S1 may be at ground or some unknown intermediate voltage level between ground and V1. If S1 is at some intermediate voltage level, then transistors P0, N0, and N2 may all be partially turned on at the same time. If transistors P0 and N0 are both partially turned on, then node S1N may also be driven to some indeterminate intermediate voltage level. This in turn may partially turn on N1. If N1 and N2 are both partially turned on, then P2 and P1 might also be partially turned on, possibly leading to indeterminate intermediate voltage levels at nodes B and C (e.g., between ground and the full-voltage level V2). If node C is at an intermediate voltage level, then both P3 and N3 might also be partially on, resulting in an indeterminate level for output signal S2.

If S2 having an indeterminate voltage level is applied to slave circuit 106, certain undesirable results may follow, depending on the particular design of slave circuit 106. For example, during configuration of an FPGA, I/O circuitry (corresponding to master circuit 102) may be used to transmit configuration data to the FPGA's programmable logic core (corresponding to slave circuit 106). If indeterminate signals are received, the logic core might be erroneously configured.

In addition, if transistors P3 and N3 of FIG. 2 are both at least partially turned on at the same time, then an undesirable crowbar current (e.g., a type of short-circuit current) can exist between the V2 power supply and ground through output buffer 206.

In an effort to produce a known state for the output signal S2, one previous solution was to control the sequence at which the power supplies are turn on (e.g., turning on V1 before V2 to ensure that V1 reaches its full-voltage level before V2 does). This solution does not address all situations, such as hot-socket plug-in, where the power supplies are already on but where the different voltage levels might ramp up at different times and/or rates within the newly added circuitry.

Figure 3:
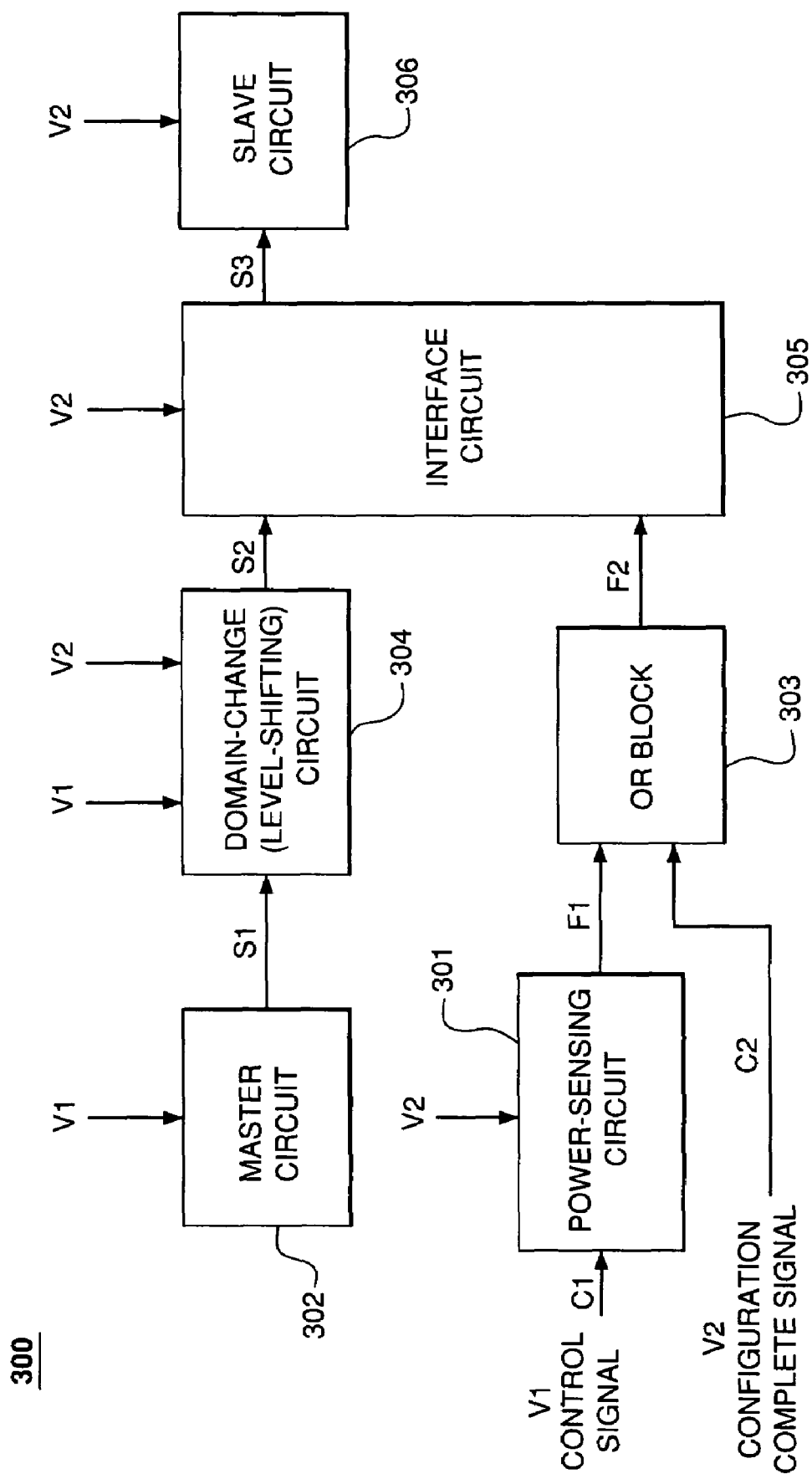
FIG. 3 shows a block diagram of an electrical system, according to one embodiment of the present invention.

FIG. 3 shows a block diagram of an electrical system 300, according to one embodiment of the present invention. Like electrical system 100 of FIG. 1, electrical system 300 has master circuit 302 operating under the V1 domain to generate signal S1, slave circuit 306 operating under the V2 domain, and level-shifting circuit 304 adapted to convert the V1-domain signal S1 into the V2-domain signal S2. Here, however, electrical system 300 also includes an interface circuit 305 operating under the V2-domain to generate, based on S2 and a flag signal F2, a V2-domain signal S3 that gets applied to slave circuit 306, instead of applying S2 directly to the slave circuit, as in FIG. 1.

Although the application of the present invention is not limited to programmable devices, FIG. 3 by way of example illustrates a portion of the core of a programmable device, such as an FPGA. The programmable device may be designed using the latest and most-dense IC technology with the lowest power supply levels to reduce power, chip area, and cost, but with the ability to be configured with external components implemented using older IC technologies that operate at higher voltages and conform to different I/O standards.

As shown in FIG. 3, flag signal F2 is generated by OR block 303 based on a V2 power supply configuration-complete signal C2 and an intermediate flag signal F1, which is itself generated by V2-domain power-sensing circuit 301 based on a V1 power supply control signal C1. V1 power supply control signal C1 is generated by a conventional power-supply monitor (not shown) that indicates (i.e., by C1 high) if the voltage generated by the V1 power supply is at a sufficiently high level to ensure proper operation of all V1-domain circuitry in electrical system 300. Similarly, V2 power supply configuration-complete signal C2 is generated by conventional circuitry (not shown) that indicates (i.e., by C2 low) if the configuration of the V2 power supply is complete. In alternative embodiments, gating control functions different from that provided by blocks 301 and 303 can be implemented based on any suitable set of one or more input conditions related to one or more situations such as power-on, configuration, handshaking, etc.

If V1 control signal C1 is low, then power-sensing circuit 301 drives intermediate flag F1 high, and, if C1 is high, then power-sensing circuit 301 drives F1 low. If either F1 or C2 is high, then OR block drives flag F2 high, and, if both F1 and C2 are low, then OR block 303 drives F2 low. In one possible implementation, OR block 303 comprises a NOR gate followed in series by an inverter. Other equivalent arrangements of logic gates can, of course, be used to evaluate the states of F1 and C2.

If flag F2 is high, then, independent of the value of signal S2 from level-shifting circuit 304, interface circuit 305 drives signal S3 to either a determinate high level (e.g., V2) or a determinate low level (e.g., ground), depending on the particular implementation. If, however, flag F2 is low, then interface circuit 305 drives S3 based on S2, where S3 is driven high if S2 is high, and S3 is driven low if S2 is low.

Thus, in electrical system 300, signal S3 is based on signal S2 only if (1) the V1 power supply is operating at (or sufficiently close to) its full-voltage level and (2) the configuration of the V2 power supply is complete. If (1) the V1 power supply is not operating near its full-voltage level or (2) the configuration of the V2 power supply is not complete or (3) both, then signal S3 is driven to a determinate level. In this way, certain situations that can lead to the output of level-shifting circuit 304 (e.g., signal S2) being indeterminate will not result in indeterminate, and potentially undesirable, operations of slave circuit 306.

Figure 4:
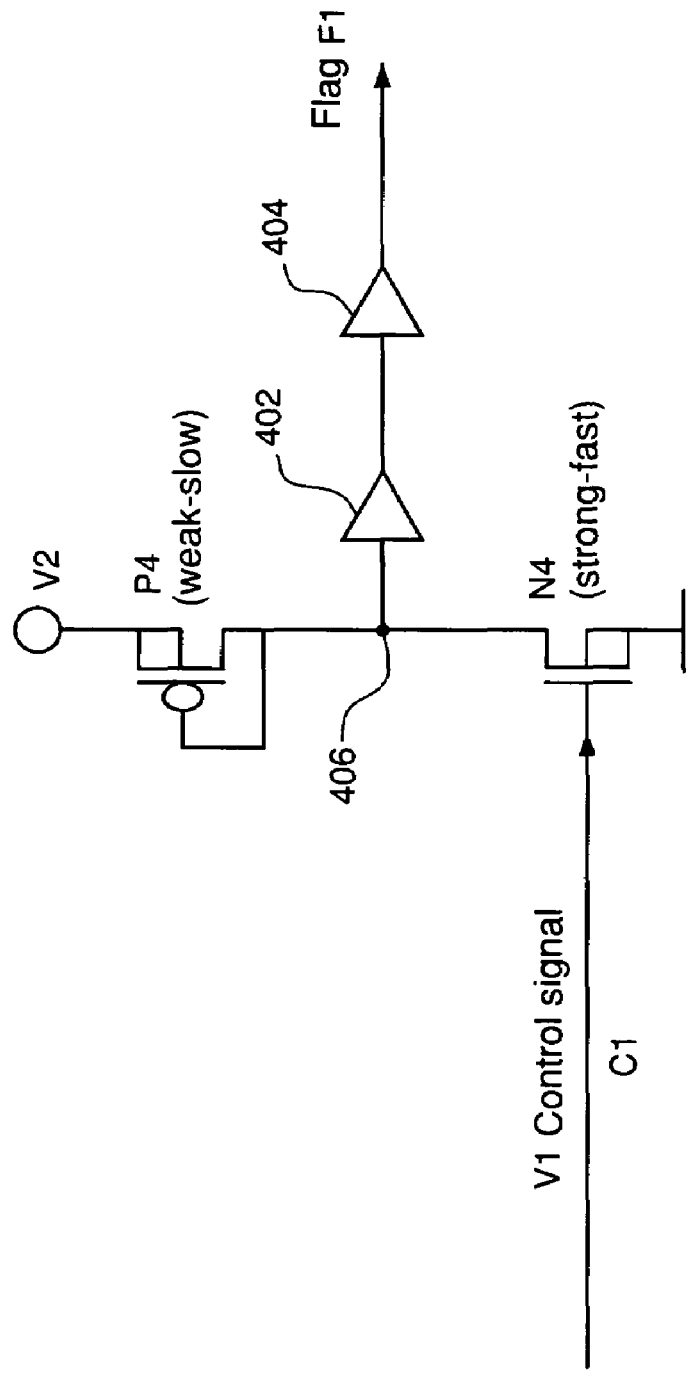
FIG. 4 shows a circuit diagram of an exemplary implementation of the power-sensing circuit of FIG. 3.

FIG. 4 shows a circuit diagram of an exemplary implementation of power-sensing circuit 301 of FIG. 3. In this implementation, power-sensing circuit 301 has P-type transistor P4, N-type transistor N4, and a pair of inverting output buffers 402, 404, connected as shown, where P4 is weaker and slower than N4. As configured, P4 is always at least partially on. If the V1 control signal C1 is low, then N4 is off and node 406 will be driven (relatively) slowly and weakly to V2 (i.e., high) and intermediate flag F1 will be driven high through buffers 402, 404. If, however, C1 is high, then N4 is on and the stronger, faster N4 will drive node 406 low, notwithstanding the fact that P4 is also on. This in turn will drive flag F1 low through buffers 402, 404. Thus, flag F1 is driven low only after the V1 control signal C1 goes from low to high. Note that intermediate flag F1 and/or flag F2 may be buffered to drive any desired number of interface circuits, like interface circuit 305 of FIG. 3.

Figure 5:
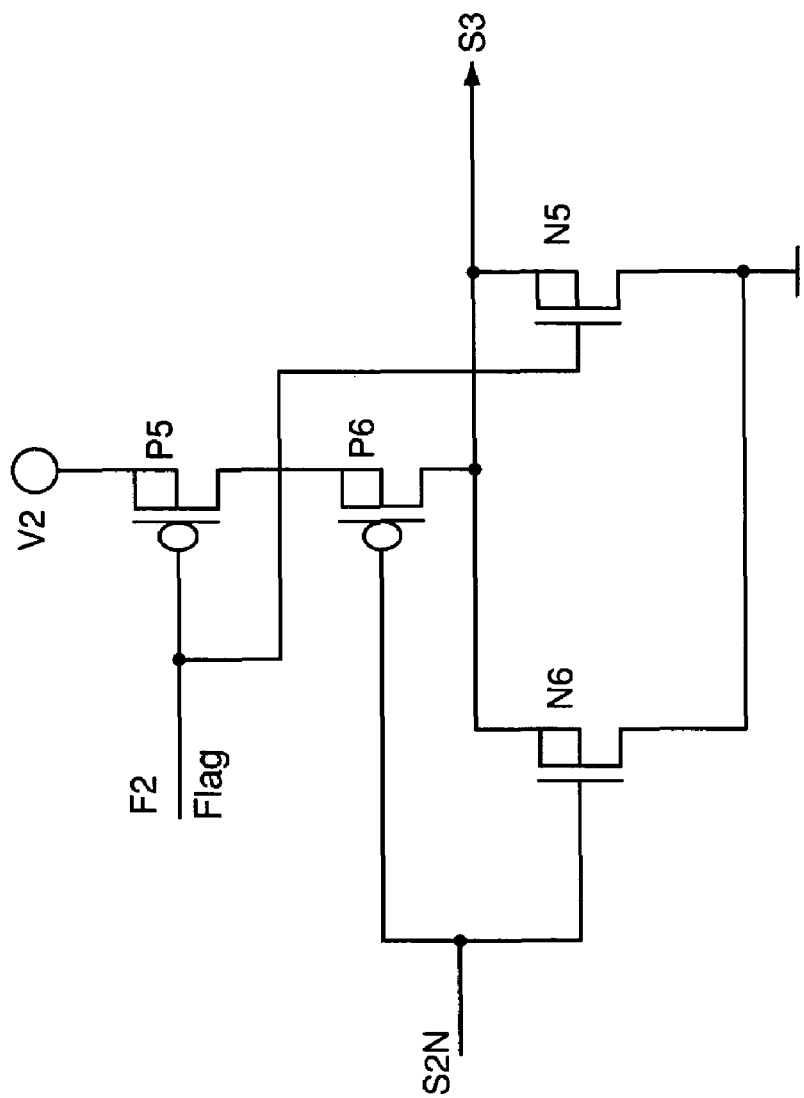
FIG. 5 shows a circuit diagram of a first exemplary circuit that can be used to implement the interface circuit of FIG. 3.

FIG. 5 shows a circuit diagram of a first exemplary circuit 500 that can be used to implement interface circuit 305 of FIG. 3. Circuit 500 has two P-type transistors P5, P6 and two N-type transistors N5, N6, connected as shown. Note that circuit 500 receives input signal S2N, which is an inverted version of signal S2 of FIG. 3, where S2N is low if S2 is high, and vice versa. Note that, if S2 is indeterminate, S2N may also be indeterminate.

Circuit 500 implements a logical NOR operation between S2N and flag F2. In particular, if F2 is high, then N5 is on, P5 is off, and S3 is driven low, independent of the value of S2N.

On the other hand, if F2 is low, then N5 is off and P5 is on. In that case, if S2N is high, then P6 is off, N6 is on, and S3 is driven low. However, if S2N is low, then P6 is on, N6 is off, and S3 is driven to V2 (i.e., high).

Figure 6:
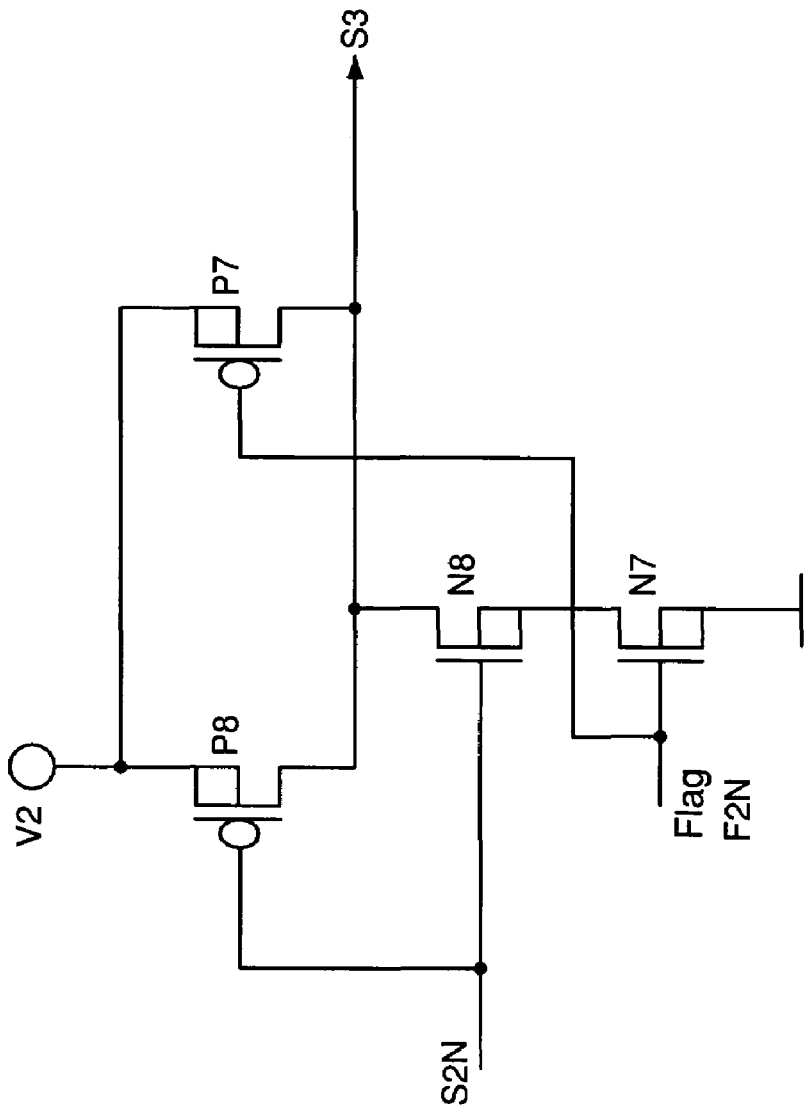
FIG. 6 shows a circuit diagram of a second exemplary circuit that can be used to implement the interface circuit of FIG. 3.

FIG. 6 shows a circuit diagram of a second exemplary circuit 600 that can be used to implement interface circuit 305 of FIG. 3. Circuit 600 has two P-type transistors P7, P8 and two N-type transistors N7, N8, connected as shown. Note that, like circuit 500 of FIG. 5, circuit 600 receives input signal S2N, which is an inverted version of signal S2 of FIG. 3. In addition and unlike circuit 500, circuit 600 receives inverted flag signal F2N, which is an inverted version of flag F2 of FIG. 3, where F2N is low, if F2 is high, and vice versa.

Circuit 600 implements a logical NAND operation between S2N and F2N. In particular, if F2N is low, then N7 is off, P7 is on, and S3 is driven to V2 (i.e., high) independent of the value of S2N.

On the other hand, if flag F2N is high, then N7 is on and P7 is off. In that case, if S2N is high, then P8 is off, N8 is on, and S3 is driven low. However, if S2N is low, then P8 is on, N8 is off, and S3 is driven to V2 (i.e., high).

Using either circuit 500 of FIG. 5 or circuit 600 of FIG. 6, interface circuit 305 of FIG. 3 ensures that signal S3 is determinate under certain situations where signal S2 is indeterminate. If the situation is only temporary, as during power-on or hot-socket operations, then, after both power supplies V1 and V2 have reached their proper operating levels, S2 will no longer be indeterminate, and interface circuit 305 will be allowed to use S2 to generate S3 for application to slave circuit 306.

FIGS. 5 and 6 show examples of two possible sets of logic gate circuitry corresponding to NOR and NAND logic that can be used in the present invention. The invention can also be implemented using other circuit configurations for providing NOR and NAND logic as well as any other suitable type of logic gate circuitry such as "and or invert" (AOI), "or and invert" (OAI), "exclusive or" (XOR), "exclusive nor" (XNOR), etc.

In addition to ensuring that output signal S3 is determinate, either circuit 500 or 600 can be merged with inverting output buffer 206 of FIG. 2 to provide an additional advantage of reducing the chances of crowbar current through the transistors of that output buffer.

Figure 7:
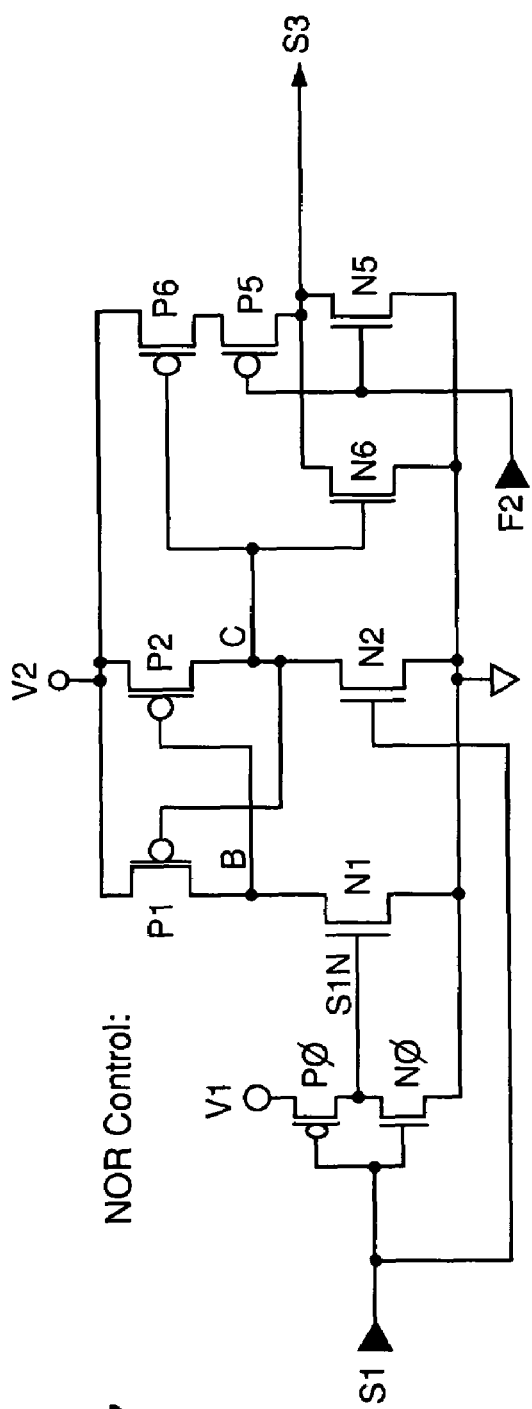
FIG. 7 shows a block diagram of an integrated implementation of the level-shifting circuit and interface circuit of FIG. 3 that results from merging the circuit of FIG. 5 with the output buffer of FIG. 2.

For example, FIG. 7 shows a block diagram of an integrated implementation of level-shifting circuit 304 and interface circuit 305 of FIG. 3 that results from merging circuit 500 of FIG. 5 with output buffer 206 of FIG. 2, where transistors P3 and N3 of FIG. 2 are replaced by transistors P5, P6, N5, and N6 of circuit 500, and node C of FIG. 2 applies signal S2N to circuit 500. In this integrated implementation, even if signal S2N at node C is at an indeterminate intermediate level (e.g., as a result of V1 not being at the proper full-voltage level) and transistors P6 and N6 are both partially on at the same time, flag F2 will ensure that transistor P5 is off, thereby preventing crowbar current between the V2 power supply and ground.

Figure 8:
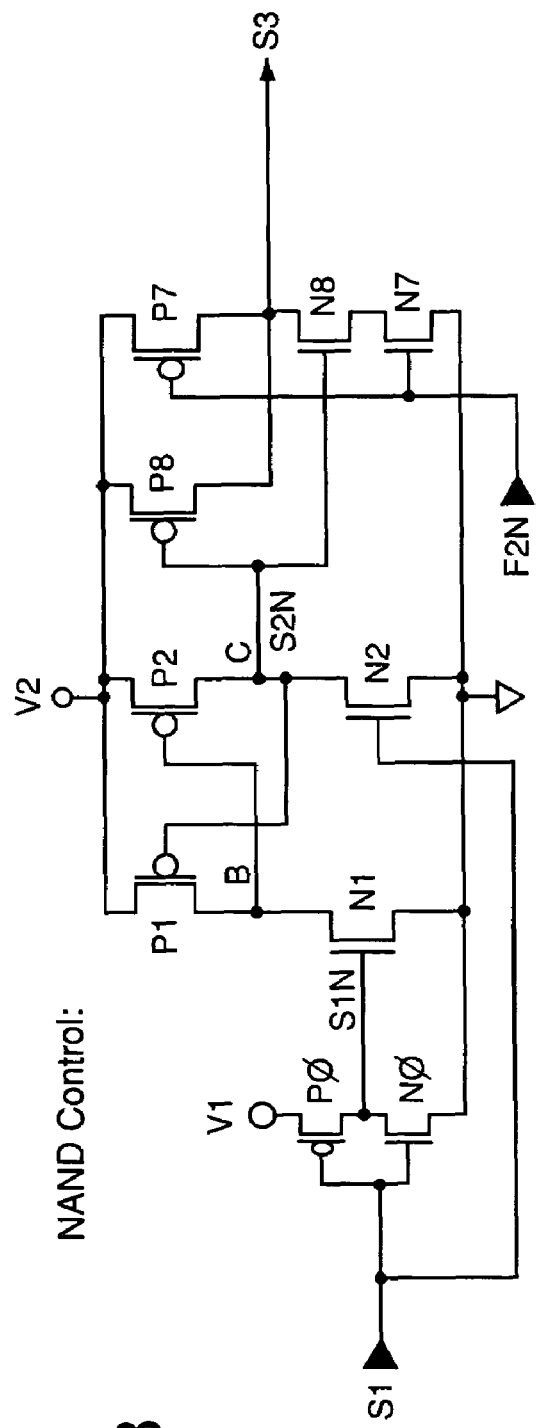
FIG. 8 shows a block diagram of an alternative integrated implementation of the level-shifting circuit and interface circuit of FIG. 3 that results from merging the circuit of FIG. 6 with the output buffer of FIG. 2.

Alternatively, FIG. 8 shows a block diagram of an alternative integrated implementation of level-shifting circuit 304 and interface circuit 305 of FIG. 3 that results from merging circuit 600 of FIG. 6 with output buffer 206 of FIG. 2, where transistors P3 and N3 of FIG. 2 are replaced by transistors P7, P8, N7, and N8 of circuit 600, and node C of FIG. 2 applies signal S2N to circuit 600. In this alternative integrated implementation, even if signal S2N at node C is at an indeterminate intermediate level and transistors P8 and N8 are both partially on at the same time, flag F2N will ensure that transistor N7 is off, thereby preventing crowbar current between the V2 power supply and ground.

In one application of the present invention, electrical system 300 of FIG. 3 is part of an FPGA, slave circuit 306 is programmable circuitry that is configured at start-up of the FPGA, and master circuit 302 is configuration-setting logic that is responsible for configuring the programmable circuitry. In this particular implementation, one possible operating state is power-on, another is configuration, and a third is user-mode. (In general, implementations may have one or more states that might or might not include one or more of these three states.) During power-on, the power supplies are turned on and can come up such that V2 is on before V1, as previously discussed. During configuration, some of the configuration signals can be released to a default state that is still deterministic, but allows the I/O devices to operate in a predetermined mode allowing an interface to the configuration logic for data to be transferred in and out of the programmable part. The user-mode state exists if all programmable I/O devices are released from control of the interface circuit and the configuration signals are passed to the downstream circuits. By using a combination of V1 control signal C1 and V2 configuration complete signal C2 as shown in FIG. 3, the configuration of programmable devices can be controlled from power-on to the user-mode without any indeterminate states. Therefore, unwanted effects from such indeterminate states as discussed previously are obviated.

The present invention has been described in the context of the exemplary level-shifting circuit of FIG. 2. In alternative embodiments, the present invention can be implemented using any suitable level-shifting circuits, including those in which the logic of the output signal S2 is either inverted or non-inverted relative to the logic of the input signal S1. For example, one possible inverting level-shifting circuit can be implemented by interchanging signals S1 and S1N in FIG. 2.

Although the present invention has been described in the context of applications in which a level-shifting circuit (or, more generally, a domain-change circuit) is provided to convert between two different signal domains, flags such as flag F1 or flag F2 of FIG. 3 can be used to inhibit the propagation of indeterminate signals within an electrical system and/or to reduce the chances of crowbar currents in other types of applications.

Figure 9:
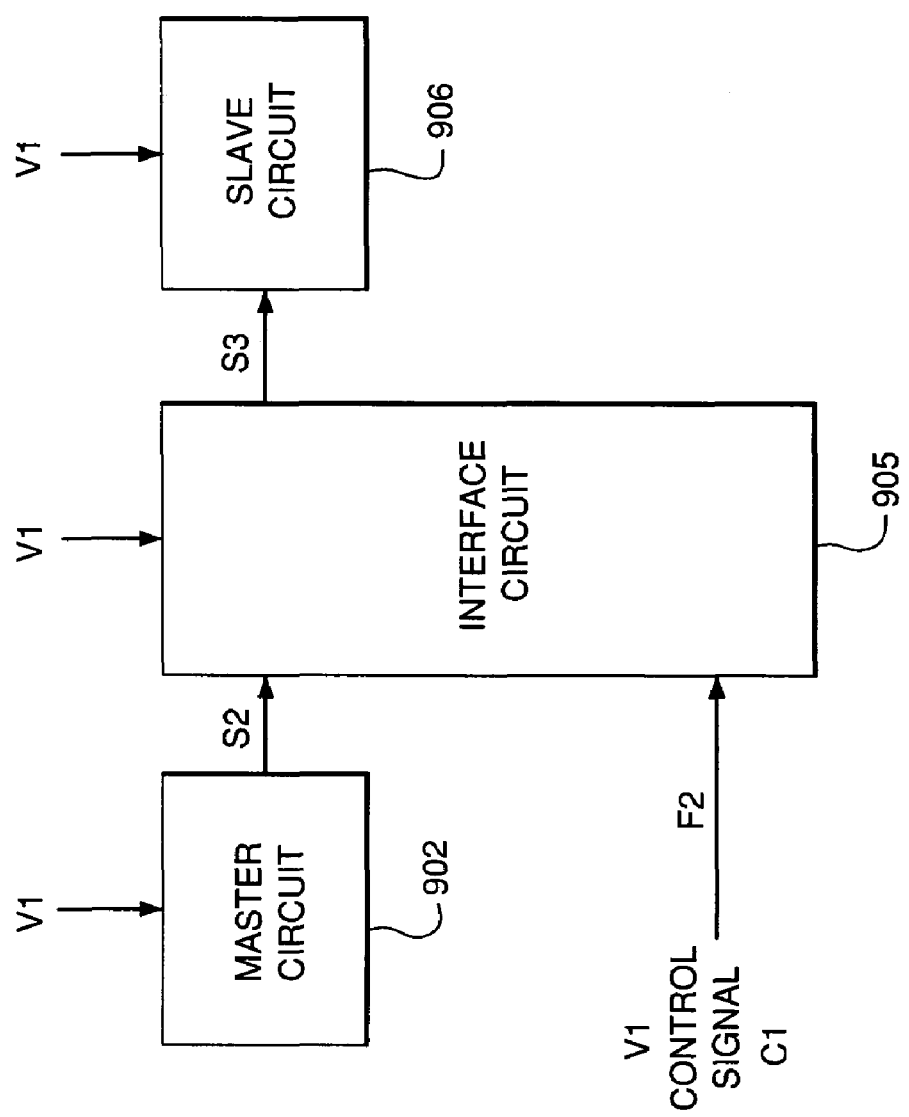
FIG. 9 shows a block diagram of an alternative electrical system that is not based on the level-shifting application of FIG. 3.

For example, FIG. 9 shows a block diagram of an alternative electrical system 900 that is not based on the level-shifting or domain-change application of FIG. 3. Electrical system 900 comprises master circuit 902, interface circuit 905, and slave circuit 906, which are analogous to corresponding blocks in FIG. 3, but with some differences.

For example, in FIG. 9, since all of the blocks operate under the domain of a single power supply (e.g., V1), the V1 power supply control signal C1 can be used as flag signal F2, thereby omitting the power-sensing circuit and the OR block of FIG. 3. Note that, depending on the particular implementation of interface circuit 905, flag F2 may need to be inverted before being applied to interface circuit 905. Also, in the absence of a level-shifting circuit, such as circuit 304 of FIG. 3, the output from master circuit 902 is applied directly to interface circuit 905.

As with interface circuit 305 of FIG. 3, exemplary circuits 500 and 600 of FIGS. 5 and 6 can alternatively be used to implement interface circuit 905, where an inverted version of signal S2 is applied to the circuit. Such implementations provide the dual advantages of (1) inhibiting the propagation of indeterminate signals within the electrical system and (2) reducing the chances of crowbar currents. In fact, circuit 500, circuit 600, or any of their functional equivalents can, in theory, be used in place of any inverting buffer in an electrical system. This principle can also be extended to apply to non-inverting buffers.

While the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An electrical system comprising:
   a master circuit adapted to generate a master output signal conforming to a first power-supply domain;
   a domain-change circuit adapted to convert the first-domain master output signal into an interface input signal conforming to a second power-supply domain different from the first power-supply domain;
   flag-generation circuitry adapted to receive a first logical control signal indicating status of the first power supply and generate a flag signal based on the first logical control signal, wherein the flag signal conforms to the second power-supply domain; and
   an interface (I/F) circuit adapted to receive the I/F input signal and the flag signal and generate an I/F output signal for application to a slave circuit, wherein the interface circuit is adapted to generate the I/F output signal either dependent on or independent of the I/F input signal as indicated by the flag signal.

2. The invention of claim 1, wherein:
   the interface circuit is adapted to generate the I/F output signal dependent on the I/F input signal if the flag signal has a first value; and
   the interface circuit is adapted to generate the I/F output signal independent of the I/F input signal if the flag signal has a second value different from the first value.

3. The invention of claim 2, wherein:
   the first value is one of a ground voltage level and a full-voltage level for the second power supply used by the interface circuit to generate the I/F output signal; and
   the second value is the other of the ground voltage level and the full-voltage level.

4. The invention of claim 1, wherein:
the flag signal indicates status of the first power supply used by the master circuit to generate the master output signal; and
the interface circuit is adapted to generate the I/F output signal independent of the I/F input signal, if the flag signal indicates that the first power supply is not generating a sufficiently high voltage level.

5. The invention of claim 4, wherein the flag-generation circuitry is adapted to generate the flag signal based on the first logical control signal indicating the status of the first power supply and a second logical control signal indicating status of the second power supply used to power the interface circuit.

6. The invention of claim 1, wherein, if the flag signal indicates that the interface circuit is to generate the I/F output signal independent of the I/F input signal, then the interface circuit generates the I/F output signal with one or more determinate characteristics, even if the I/F input signal has one or more indeterminate characteristics.

7. The invention of claim 6, wherein:
the one or more indeterminate characteristics of the I/F input signal include an indeterminate voltage level; and
the determinate characteristics of the I/F output signal include a determinate voltage level.

8. The invention of claim 1, wherein:
the domain-change circuit is a level-shifting circuit; and
a first-domain full-voltage level corresponding to the first power-supply domain is different from a second-domain full-voltage level corresponding to the second power-supply domain.

9. The invention of claim 1, wherein the domain-change circuit and the interface circuit are implemented as a merged circuit in which the interface circuit is adapted to function as an output buffer of the domain-change circuit.

10. The invention of claim 9, wherein the output buffer has a transistor configuration adapted to inhibit an indeterminate I/F input signal from resulting in crossbar current across the output buffer.

11. The invention of claim 1, wherein the flag-generation circuitry comprises a power-sensing circuit adapted to receive the first logical control signal conforming to the first domain and generate a second-domain flag signal, wherein the flag signal applied to the interface circuit is based on the second-domain flag signal.

12. The invention of claim 11, wherein:
the power-sensing circuit comprises a weak transistor coupled to a strong transistor;
if the first logical control signal indicates that the first power supply is not generating a sufficiently high voltage level, then the second-domain flag signal is based primarily on the weak transistor; and
if the first logical control signal indicates that the first power supply is generating a sufficiently high voltage level, then the second-domain flag signal is based primarily on the strong transistor.

13. The invention of claim 11, wherein the flag-generation circuitry further comprises a logic block adapted to receive the second-domain flag signal and a second logical control signal indicating status of the second power supply and generate the flag signal applied to the interface circuit.

14. The invention of claim 1, wherein:
the interface circuit comprises a plurality of transistors;
the gates of a first pair of the transistors are connected to receive the I/F input signal;
the gates of a second pair of the transistors are connected to receive the flag signal;
if the flag signal has a first flag input level, then a first transistor in the first pair is on, a second transistor in the first pair is off, and the interface circuit drives the I/F output signal to a first I/F output level independent of the I/F input signal; and
if the flag signal has a second flag input level different from the first flag input level, then the first transistor in the first pair is off, the second transistor in the first pair is on, and the interface circuit drives the I/F output signal based on the I/F input signal, such that:
if the I/F input signal has a first I/F input level, then a first transistor in the second pair is on, a second transistor in the second pair is off, and the interface circuit drives the I/F output signal to the first I/F output level; and
if the I/F input signal has a second I/F input level, then the first transistor in the second pair is off, the second transistor in the second pair is on, and the interface circuit drives the I/F output signal to a second I/F output level.

15. The invention of claim 14, wherein:
the first pair of transistors comprises a first P-type transistor and a first N-type transistor; and
the second pair of transistors comprises a second P-type transistor and a second N-type transistor.

16. The invention of claim 15, wherein:
the first and second P-type transistors are connected in series between a first reference voltage level and an IF output node corresponding to the I/F output signal; and
the first and second N-type transistors are connected in parallel between the I/F output node and a second reference voltage level.

17. The invention of claim 15, wherein:
the first and second P-type transistors are connected in parallel between a first reference voltage level and an I/F output node corresponding to the I/F output signal; and
the first and second N-type transistors are connected in series between the I/F output node and a second reference voltage level.

18. The invention of claim 1, wherein the electrical system is implemented in a single integrated circuit.

19. The invention of claim 1, wherein the electrical system is a field-programmable gate array.

20. The invention of claim 19, wherein:
the master circuit comprises configuration-setting logic; and
the slave circuit comprises circuitry whose operations are dependent on the I/F output signal.

21. The invention of claim 5, wherein:
the first logical control signal indicates whether the voltage generated by the first power supply is at a sufficiently high voltage level to ensure proper operation of all first-domain circuitry in the electrical system; and
the second logical control signal indicates whether configuration of the second power supply is complete.

22. The invention of claim 5, wherein:
the first logical control signal conforms to the first power-supply domain; and
the second logical control signal conforms to the second power-supply domain.

23. A method of processing signals in an electrical system, comprising:
generating a master output signal conforming to a first power-supply domain;

converting the first-domain master output signal into an interface input signal conforming to a second power-supply domain different from the first power-supply domain;

receiving a first logical control signal indicating status of the first power supply and generating a flag signal based on the first logical control signal, wherein the flag signal conforms to the second power-supply domain; and generating an interface (I/F) output signal either dependent on or independent of the I/F input signal as indicated by the flag signal.

24. The invention of claim 23, wherein the flag signal is generated based on the first logical control signal indicating the status of the first power supply and a second logical control signal indicating status of the second power supply used to power the interface circuit.

25. The invention of claim 24, wherein:

the first logical control signal indicates whether the voltage generated by the first power supply is at a sufficiently high voltage level to ensure proper operation of all first-domain circuitry in the electrical system; and the second logical control signal indicates whether configuration of the second power supply is complete.

26. The invention of claim 24, wherein:

the first logical control signal conforms to the first power-supply domain; and the second logical control signal conforms to the second power-supply domain.

27. An electrical system comprising:

means for generating a master output signal conforming to a first power-supply domain;

means for converting the first-domain master output signal into an interface (I/F) input signal conforming to a second power-supply domain different from the first power-supply domain;

means for receiving a first logical control signal indicating status of the first power supply and generating a flag signal based on the first logical control signal, wherein the flag signal conforms to the second power-supply domain; and means for generating an interface (I/F) output signal either dependent on or independent of the I/F input signal as indicated by the flag signal.

28. The invention of claim 27, wherein the flag signal is generated based on the first logical control signal indicating the status of the first power supply and a second logical control signal indicating status of the second power supply used to power the interface circuit.

29. The invention of claim 28, wherein:

the first logical control signal indicates whether the voltage generated by the first power supply is at a sufficiently high voltage level to ensure proper operation of all first-domain circuitry in the electrical system; and the second logical control signal indicates whether configuration of the second power supply is complete.

30. The invention of claim 28, wherein:

the first logical control signal conforms to the first power-supply domain; and the second logical control signal conforms to the second power-supply domain.

* * * * *